United States Patent [19]

Boese et al.

[11] 4,115,687

[45] Sep. 19, 1978

[54] CIRCUIT ARRANGEMENT FOR CONTROLLING THE PULSE REPETITION FREQUENCY OF A SIGNAL

[75] Inventors: Günter Boese; Ernst Neudorfer, both of Munich; Gero Schollmeier, Gauting, all of Fed. Rep. of Germany

[73] Assignee: Siemens Aktiengesellschaft, Munich, Fed. Rep. of Germany

[21] Appl. No.: 786,214

[22] Filed: Apr. 11, 1977

[30] Foreign Application Priority Data

Apr. 14, 1976 [DE] Fed. Rep. of Germany ....... 2616398

[51] Int. Cl.² .............................................. H03K 21/36
[52] U.S. Cl. .......................... 235/92 DM; 235/92 PE; 235/92 R; 328/48
[58] Field of Search ....... 235/92 DM, 92 CC, 92 PE, 235/92 FQ, 92 PL; 328/48

[56] References Cited

U.S. PATENT DOCUMENTS

| | | | |
|---|---|---|---|
| 3,413,452 | 11/1968 | Schlein ........................... | 235/92 PE |
| 3,581,066 | 5/1971 | Maure et al. ................... | 235/92 PE |
| 3,840,724 | 10/1974 | Tripp ............................... | 235/92 PL |
| 3,937,932 | 2/1976 | Ahlgren ........................... | 235/92 PE |

Primary Examiner—Joseph M. Thesz
Attorney, Agent, or Firm—Schuyler, Birch, Swindler, McKie & Beckett

[57] ABSTRACT

A circuit arrangement is described wherein the pulse repetition frequency of a signal is digitally controlled in dependence on the pulse repetition frequency of a controlling signal. A presettable digital counter functioning as a frequency divider operates between preset initial and end counts and is reset to the initial value each time the end value is reached; the initial and end values are set responsive to binary signals applied to control inputs of the counter. A bistable trigger stage assumes either an idle or an operative state in dependence on the value of a control signal derived from the controlling pulse repetition frequency and a timing signal. The trigger stage output is used to control either the setting of the afore-mentioned initial value or the end value to produce either too high or too low values for the pulse repetition frequency of the controlled signal.

7 Claims, 4 Drawing Figures

Fig. 2

CIRCUIT ARRANGEMENT FOR CONTROLLING THE PULSE REPETITION FREQUENCY OF A SIGNAL

BACKGROUND OF THE INVENTION

The invention relates to a circuit arrangement for controlling the pulse repetition frequency of a controlled signal as a function of a control signal.

It is an object of the invention to provide a circuit arrangement of the type described hereinabove where control of the pulse repetition frequency of the controlled signal is by means of a digital signal so that any desired accuracy may be obtained using circuitry of relatively little complexity.

SUMMARY OF THE INVENTION

The above and other objects are achieved by the invention in that there is provided as a frequency divider a programmable counter which starts counting from an initial counter reading, and after reaching a final counter reading, is reset to the initial counter reading. The final and/or initial counter readings can be adjusted with binary signals applied to control inputs of the counter. A clock generator is provided which produces a timing signal. A bistable trigger element is provided having a set input, a timing input, and an output which takes on an idle or operative state as a function of the control signal applied to the set input and as a function of the timing signal. The bistable stage supplies via its output a trigger element signal indicating the idle or operative condition, and the trigger element signal is applied to at least one of the control inputs of the counter. Thus, as a function of the binary state of the trigger element signal variable initial and/or variable final counter readings are set which yield a too high or too low pulse repetition frequency of the controlled signal.

The circuit arrangement constructed in accordance with the principles of the invention is characterized by its digital mode of operation, because all components used, such as the counter and the bistable trigger element operate in a digital mode. Using a sufficiently high pulse repetition frequency for the oscillator signal and correspondingly short counting periods, it is possible to achieve substantially any desired degree of accuracy in approximating the pulse repetition frequency of the controlled signal to that of another signal, the latter signal being used to adjust the controlling signal.

In order to set up a plurality of two variable initial and/or two variable final counter readings, it is advantageous to apply binary signals to two or more control inputs, whose binary values remain constant while the counter is in use.

To achieve the highest possible accuracy of control at a specified oscillator frequency and with a specified division ratio, it is advantageous to make the difference between the variable initial and/or the difference between the variable final counter readings equal 1. This holds true provided that the control range is maintained.

To ensure an extremely stable mode of operation of the programmed counter, it is advantageous for the clock signal not to occur at the moments when the variable initial or variable final counter readings, as the case may be, occur.

The pulse repetition frequencies of the controlled signal may be altered by varying the two variable initial and/or the two variable final counter readings. To dispense with a special setting of the clock signal if such variations occur, the counter can be provided with two or more counter signal outputs over which a counting signal is supplied. The counting signal can be used to characterize the instantaneous reading of the counter. A blocking device is provided for inhibiting a change in state of the trigger element when the blocking device receives a blocking signal. The latter signal is formed using the counting signal whenever variable initial and/or end counts are set up.

To obtain a controlled signal with great phase stability, a measuring device can be provided which generates the control signal as a function of the difference between the pulse repetition rate of the controlled signal and that of another signal. The pulse repetition rate of the other signal satisfies the unbalanced equation $F1/m2 \leq F2 \leq F1/m1$, wherein the pulse repetition frequency of the oscillator signal is designated by the reference symbol F1, the pulse repetition frequency of the other signal by the reference symbol F2, and the two reciprocal values of the division ratios by the reference symbols $m1$ and $m2$, the division ratio $m2$ being greater than the division ratio $m1$.

BRIEF DESCRIPTION OF THE DRAWINGS

The principles of the invention will be more readily understood by reference to the following description of preferred embodiments in conjunction with the drawings which are briefly described as follows.

DETAILED DESCRIPTION OF THE PREFERRED EMBODIMENTS

Figure 1:
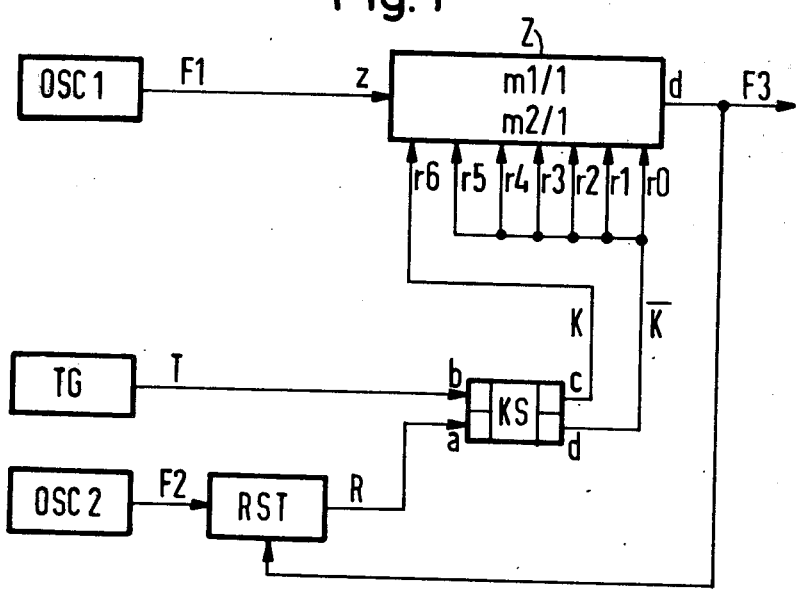
FIGS. 1 and 2 are schematic diagrams of alternative preferred embodiments of circuit arrangements for controlling the pulse repetition rate of a signal.

In FIG. 1 oscillator OSC1 supplies signal F1 to a counter Z. Clock generator TG provides timing signal T to trigger element KS. Oscillator OSC2 supplies signal F2 to control stage RST which supplies control signal R to bistable trigger. The circuit arrangement has the function of controlling the pulse repetition rate of signal F3 supplied from output $d$ of counter Z as a function of control signal R and as a function of the pulse repetition frequency of signal F2. Oscillator OSC2, which produces signal F2, may be spaced any distance from control stage RST. It is assumed, however, that in control stage RST the pulse repetition frequency of signals F2 and F3 are compared with each other resulting in the control signal R which indicates if the pulse repetition rate of signal F3 is higher or lower than that of signal F2. The circuit arrangement shown thus permits the synchronization of signal F3 as a function of signal F2.

The programmable counter Z has a counter input $z$, and output $d$, and two or more control inputs $r0$, $r1$, $r2$, $r3$, $r4$, $r5$ and $r6$. With each pulse of signal F1, the counter Z is incremented until a final counter reading is reached; the value of that reading can be preset by means of binary signals applied to control inputs $r0$ to $r6$. After reaching the final counter reading, the counter is automatically reset to an initial counter reading. With each pulse of signal F1, the counter is incremented again until the final counter reading is attained.

Trigger element KS receives, via set input $a$, control signal R, via clock input $b$, clock signal T, and supplies trigger element signal K via its output $c$. The idle or operative condition as the case may be, of trigger element KS is set by the binary values of trigger element signal K=0 or K=1. Signal R=0 or R=1 is passed on to output $c$, if at the same time a transition of signal T=0 to T=1 occurs at clock input $b$. Trigger element KS supplies trigger element signal $\overline{K}$ via its output $d$. Trigger element signals K or $\overline{K}$ are thus complementary to each other. Another possibility would be to form clock signal T in such a manner that upon completion of the counting cycle no positive transition of clock signal T occurs.

Control inputs $r0$ to $r5$ of counter Z receive trigger element signal $\overline{K}$, whereas control input $r6$ receives trigger element signal K.

When the word 1000000 is applied to control inputs $r6$ to $r0$, the counter counts up to 64, and when the word 0111111 is applied to control inputs $r6$ to $r0$, the counter counts up to 63. In this way, two final counter readings $m1=64$ or $m2=63$, as the case may be, are set using trigger element signal K. Since counter Z is connected as a frequency divider, it produces a division ratio of $m1/1$ or $m2/1$, as the case may be. If the pulse repetition frequencies of signals F1 and F3 are designated by the same reference symbols as the signals themselves, a pulse repetition frequency $F3=F1/m1$ will result for a final counter reading $m1$, and a pulse repetition frequency $F3=F1/m2$ for a final counter reading $m2$. Pulse repetition frequency F1 and final counter readings $m1$ and $m2$ are so defined that pulse repetition frequency F3 is too high for a final counter reading $m1$ or too low for a final counter reading $m2$. Specifically, the pulse repetition frequency of signal F3 is in one case higher than the pulse repetition frequency of signal F2, which is to be considered as the nominal rate, and in the other case the pulse frequency rate is lower than the nominal rate.

Figure 2:
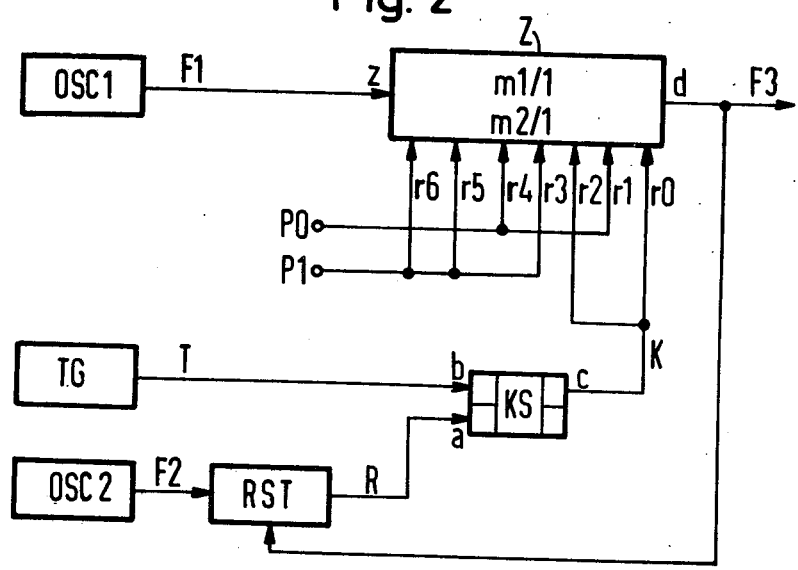

As shown in FIG. 2, control inputs $r1$, $r4$ of counter Z receive via circuit point P0 a signal 0, and control inputs $r3$, $r5$, $r6$ receive a signal 1 via circuit point P1. These signals applied to circuit points P0 or P1, as the case may be, are set prior to putting counter Z into service and remain constant. In contrast, control inputs $r0$ and $r2$ receive trigger element signal K, whose binary 0 or 1, as the case may be, is a function of the binary values of control signal R. In this way, two different division ratios $m1/1$ or $m2/1$, as the case may be, are set, again as a function of control signal R and of trigger element signal K.

Figure 3:
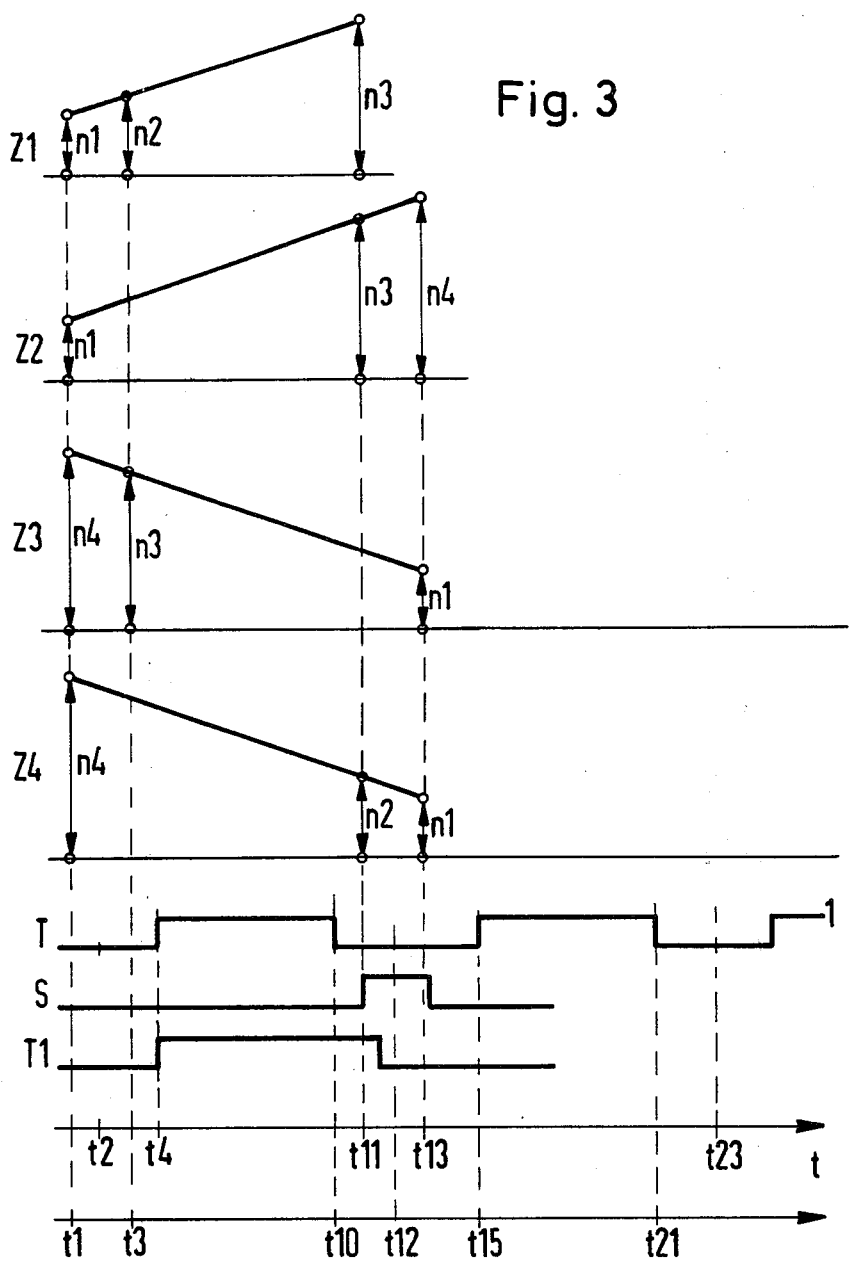
FIG. 3 contains time-waveform diagrams for illustrating the counting mode of the counter and the definition of the clock signal.

FIG. 3 shows four different operating modes of counter Z, which will be described with reference to diagrams Z1, Z2, Z3 and Z4. Diagram Z1 refers to the first mode and shows that the variable initial counter readings $n1$, $n2$ are set with trigger element signal K, and that final counter reading $n3$ is attained by incrementing the counter to final counter reading $n3$. Thereafter, one of the two initial readings is set as a function of the trigger element signal.

Diagram Z2 refers to the case where the counter is advanced upward from counter reading $n1$ and where either final counter reading $n3$ or final counter reading $n4$ is set as a function of the trigger element signal. Immediately thereafter, the counter is reset to initial counter reading $n1$.

Diagram Z3 refers to the case where, starting out from initial counter readings $n4$ and $n3$, the counter is counted downward to final counter reading $n1$. In this way, final counter readings $n4$ and $n3$ are set as a function of trigger element signal K.

Diagram Z4 refers to the case where the counter, starting from initial counter reading $n4$, is counted downward either to final counter reading $n2$ or $n1$ as a function of the trigger element signal.

The period duration of clock signal T, for example, is so defined that it equals the period needed by counter Z on an average to achieve its variable final counter readings. In the case of diagram Z1, the period duration could equal the period from time $t2$ to time $t11$, in diagram Z2 it equals the period from time $t1$ to time $t12$, in diagram Z3 it equals the period from time $t2$ to $t13$, and in diagram Z4 it equals the period from time $t1$ to time $t12$. The period of clock signal T=1 from time $t4$ to $t10$ is so defined that during this time the variable initial and the variable final counter readings do not occur. For example, as shown in diagram Z4, either final counter reading $n2$ or final counter reading $n1$ can be set from time $t10$ to $t15$, and since during this time trigger element signal K cannot be changed with clock signal T=0, there is no fear that counter Z will be disturbed. Thus, by means of clock signal T it can be prevented that a changeover to final counter reading $n1$ takes place with trigger element signal K, i.e., at moment $t11$ when final counter reading $n2$ has been set, and the operation of counter Z is not disturbed.

Aside from the operating modes in FIG. 3 shown with the aid of diagrams Z1 to Z4 it is, in principle, conceivable to combine on the one side operating modes Z1 and Z2 and, on the other, operating modes Z3 and Z4, so that both variable initial and variable final counter readings are set as a function of the trigger element signal.

If the pulse repetition frequency of oscillator signal F1 and the final counter reading of counter Z are predetermined, the greatest accuracy of control is defined if the difference between the initial counter readings or the difference between the final counter readings equals 1. For example, in the case illustrated in FIG. 1, the final counter readings are 63 and 64, so that their difference equals 1.

Figure 4:
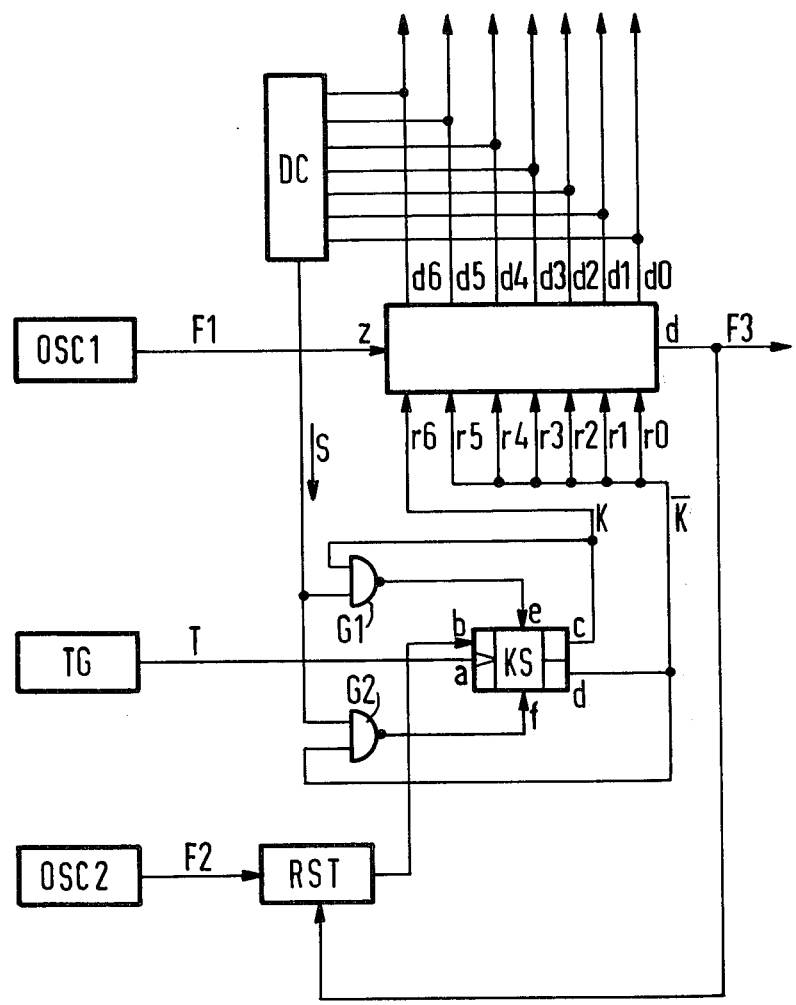
FIG. 4 is a schematic diagram of an additional preferred circuit arrangement for controlling the pulse repetition frequency of a signal using blocking stages which prevent the trigger element signal from changing when the counter has reached the variable initial and/or final counter readings.

In addition to the components shown in FIGS. 1 and 2, the circuit arrangement of FIG. 4 comprises a decoder DC and gates G1 and G2. Counter Z has two or more outputs $d0$, $d1$, $d2$, $d3$, $d4$, $d5$ and $d6$, over which signals are supplied that indicate a corresponding counter reading. As an example, it is assumed that the counter Z depicted in FIG. 4 works in accordance with the diagram Z2 of FIG. 3, where $n1=1$, $n3=63$ and $n4=64$. In this case, decoder DC is set in such a manner that it decodes counter reading $n3=63$ and supplies the disabling signal S shown in FIG. 3, which prevents trigger elements KS from switching. Trigger element KS switches to its idle condition when a signal 0 is applied to output $c$, a signal 1 to output $d$, a signal 1 to input $e$, and a signal 0 to input $f$. It switches to its operating conditions if a signal 1 is applied to output $c$, a signal 0 to output $d$, a signal 0 to input $e$, and a signal 1 to input $f$. Transition from the idle to the operating condition occurs in the case of signals 1 at inputs $a$, $e$ and $f$ whenever a signal 1 occurs at input $b$. Transition from the operating to the idle condition occurs in the case of signals 1 at inputs $a$, $e$ and $f$ whenever a signal 0 is applied to input $b$. Both NAND gates G1, G2 supply signals 0 only if signals 1 are applied to both inputs. If at moment $t11$, as shown in diagram Z2, the word 0111111, which causes counter reading $n3=63$, is applied to control signal inputs $r6$ to $r0$, a signal 1 is supplied to gate G2 from output $d$ of trigger element KS and with signal $S=1$ a signal 0 is passed via the output of gate G2 to input $f$ of trigger element KS, thereby preventing the latter from being switched. If the word 1000000 is applied to control signal inputs $r6$ to $r0$ resulting in counter reading $n4=64$, a signal 1 is dispatched from output $c$ of trigger element KS to an input of gate G1, and with signal $S=1$ the gate G1 passes a signal 0 to input $e$ of trigger element KS, disabling it. Thus, in this case decoder DS reacts to counter reading $n3=63$ and produces disabling signal S, which prevents the counter reading from changing, if instead of clock signal T clock signal T1 is applied to input $a$ of trigger element KS. If such a blocking stage made up primarily of gates G1 and G2 is employed, the generation of clock signal T is not critical, because disabling signal S, which prevents the trigger element from switching, is produced whenever the final counter readings are reached. Decoder DC is normally not required in practical cases, because there are counters Z which supply, via an output, the signal S which indicates that a specified counter reading has been reached.

The switching arrangements of FIGS. 1, 2 and 4 are relatively simple and inexpensive to construct because the setting of the counter reading of counter Z, which would be necessary to bring about an agreement in frequency between the two signals F2 and F3, is deliberately eliminated. Rather, two slightly differing counter readings $m1$ and $m2$ are selected.

The counter Z shown in FIG. 1 can also be operated in such a manner that a few control signal inputs constantly receive a signal 0, that a few other control signal inputs constantly receive a signal 1, that two or more control signal inputs receive trigger element K, and that at least one further control signal input receives the complementary trigger element signal $\overline{K}$.

In connection with a data transmission featuring a phase difference modulation carrier, signal F2, for example, may have a mominal frequency of 1800 Hz and the oscillator frequency F1 may be 3.456 MHz. In this special case, the pulse repetition frequency of signal F3, with $m1=2932$ and with $m2=1908$, may be 1.78882 kHz or 1.81132 kHz, as the case may be, so that $\pm 11$ Hz frequency errors can be corrected relative to the nominal frequency F2 of 1800 Hz.

Programmable counters Z are available commercially which are constructed using CMOS technology. A frequency divider with a permanently set division ratio so as not to be greater than the working frequency of a CMOS counter may precede counter Z. Counters Z are also available commerically which are constructed using TTL technology. Further frequency diviers with permanently set division ratios may also be connected to output $d$ of counter Z so as to produce two signals displaced by 90°.

The principles of the invention are described by describing the construction and operation of preferred embodiments. It is contemplated that the described embodiments are exemplary so that obvious modifications to them or changes in them are to be considered as being within the scope of the invention as defined by the appended claims.

We claim:

1. A circuit arrangement for regulating the pulse repetition frequency of a controlled signal in dependence upon the value of the pulse repetition frequency of a controlling signal comprising:

a presettable binary counter, the initial and end count values of which are settable responsive to signals coupled to control inputs therein, said binary counter including reset means for resetting said binary counter to said initial count valve when said end count value is reached, first source means for supplying an input signal having a first pulse repetition frequency to said binary counter for frequency division therein to produce said controlled signal, second source means for producing a controlling signal having a second pulse repetition frequency, control circuit means for producing a regulating signal indicating the difference between the pulse repetition frequencies of said controlled and controlling signals, clock generator means for producing a timing signal, bistable trigger stage having inputs connected to receive said timing and regulating signals and for assuming one of two states responsive to the values of those signals, a trigger output signal indicating the state of said bistable trigger stage being produced, and means for connecting said trigger output signal to at least one of said control inputs of said binary counter whereby in dependence on the binary value of said trigger output signal and on which of said control inputs is selected either the initial or the end count of said binary counter is varied to thereby produce a too high or to low pulse repetition frequency of said controlled signal.

2. The circuit arrangement defined in claim 1 wherein predetermined ones of said control inputs are connected to receive constant value binary signals.

3. The circuit arrangement defined in claim 1 wherein said trigger output signal is of a value and those of said control inputs are so driven as to produce a difference between said initial and end binary counter values equal to 1.

4. The switching arrangement defined in claim 1 wherein said clock generator means produces timing signals which are not coincidental in time with either of said initial and end count values.

5. The switching arrangement defined in claim 4 wherein said binary counter further includes a counter signal output for producing a counting signal having a value corresponding to the instantaneous reading of said binary counter, said switching arrangement further comprising:

blocking circuit means responsive to a blocking signal for preventing said bistable trigger stage from changing state and means for deriving said blocking signal from said counting signal upon the setting of one of said variable initial or end counts.

6. The switching arrangement defined in claim 5 wherein said binary counter further comprises at least two countersignal outputs and wherein said means for deriving comprises a decoder connected to receive said counter signal outputs and produce said blocking signal therefrom.

7. The circuit arrangement defined in claim 1 wherein said first and second source means are contructed to produce frequencies which satisfy the relationship:

$$F1/m2 \leq f2 \leq F1/m1$$

where $F1$ equals the frequency produced by said first source means, $F2$ equals the frequency produced by said second source means and $m1$ and $m2$ are reciprocal values of the frequency division ratios, $m2$ being greater than $m1$.

* * * * *